United States Patent [19]
Kelly

[11] Patent Number: 5,444,219
[45] Date of Patent: Aug. 22, 1995

[54] TEMPERATURE SENSING DEVICE AND A TEMPERATURE SENSING CIRCUIT USING SUCH A DEVICE

[75] Inventor: Brendan P. Kelly, Stockport, England

[73] Assignee: U.S. Philips Corporation, New York, N.Y.

[21] Appl. No.: 309,514

[22] Filed: Sep. 20, 1994

Related U.S. Application Data

[63] Continuation of Ser. No. 183,587, Jan. 19, 1994, abandoned, which is a continuation of Ser. No. 916,574, Jul. 20, 1992, abandoned, which is a continuation-in-part of Ser. No. 760,560, Sep. 16, 1991.

[30] Foreign Application Priority Data

Sep. 24, 1990 [GB] United Kingdom ............... 9020731
Jul. 19, 1991 [GB] United Kingdom ............... 9115694

[51] Int. Cl.$^6$ .................... H05B 1/02; H03K 3/295
[52] U.S. Cl. .................................. 219/505; 219/497; 219/501; 219/508; 219/504; 338/314; 338/225 D; 327/512
[58] Field of Search ............... 219/491, 494, 497, 501, 219/504, 505, 508, 509, 510, 9, 309, 314, 22 S, 22 D, 25; 307/491, 310

[56] References Cited

U.S. PATENT DOCUMENTS

| | | | |
|---|---|---|---|
| 3,085,193 | 4/1963 | Perino . | |
| 4,092,662 | 5/1978 | Daughton | 357/28 |
| 4,104,607 | 8/1978 | Jones | 338/309 |
| 4,136,354 | 1/1978 | Dobkin . | |
| 4,268,887 | 5/1981 | Ghiringelli et al. . | |
| 4,464,646 | 8/1984 | Burger et al. | 338/3 |
| 4,788,521 | 11/1988 | Johnson | 338/3 |
| 4,929,884 | 5/1990 | Bird et al. . | |
| 4,952,865 | 8/1990 | Pataut et al. | 323/313 |
| 4,971,921 | 11/1990 | Fukunaga et al. . | |
| 4,987,379 | 1/1991 | Hughes . | |
| 5,039,878 | 8/1991 | Armstrong et al. . | |

FOREIGN PATENT DOCUMENTS

| | | |
|---|---|---|
| 0224274 | 6/1987 | European Pat. Off. . |
| 0341482 | 11/1989 | European Pat. Off. . |
| 58-053730 | 3/1983 | Japan . |
| 59-178014 | 10/1984 | Japan . |
| 2195507 | 4/1988 | United Kingdom . |
| 2210501 | 6/1989 | United Kingdom . |
| 2222497 | 3/1990 | United Kingdom . |

OTHER PUBLICATIONS

J. Pigott et al., "Overtemperature Protection Of FETs", Motorola Technical Developments, vol. 10, Mar. 1990, pp. 54–56.

*Primary Examiner*—Mark H. Paschall
*Attorney, Agent, or Firm*—Steven R. Biren

[57] ABSTRACT

A semiconductor body (10) has a first region (13) of one formed a semiconductor device (Rx) having a resistance which varies with temperature. The semiconductor device (Rx) is formed by a second region (14) of the opposite conductivity type formed within the first region (13) and a third region (15) of the one conductivity type formed within the second region (14), with first and second electrodes (16) and (17) being spaced apart on the third region (15) so that a resistive path is provided by the third region (15) between the first and second electrodes (16 and 17) and a reference electrode (18) connecting the second region (14) to a reference potential. The impurity concentrations within the second and third regions (14 and 15) are such that the semiconductor device (Rx) has a temperature coefficient of resistance which changes, generally increases or falls only slightly, with absolute temperature such that the relative temperature coefficient of resistance referred to the sensed temperature is substantially constant. Respective temperature sensing devices may be provided adjacent to and remote from an active semiconductor device to provide a differential temperature sensor.

22 Claims, 4 Drawing Sheets

TEMPERATURE SENSING DEVICE AND A TEMPERATURE SENSING CIRCUIT USING SUCH A DEVICE

This is a continuation of application Ser. No. 08/183,587 now abandoned filed Jan. 19, 1994 which is a continuation of application Ser. No. 07/916,574 filed Jul. 20, 1992 now abandoned, which is a continuation-in-part of application Ser. No. 07/760,560 filed Sep. 16, 1991.

FIELD OF THE INVENTION

This invention relates to a temperature sensing device and a temperature sensing circuit using such a device.

BACKGROUND OF THE INVENTION

Temperature sensing devices have previously been proposed which use a semiconductor device in the form of a diffused resistor formed by diffusing into a semiconductor body of one conductivity type impurities of the opposite conductivity type providing first and second electrodes spaced-apart on the diffused region so that the diffused region provides a resistive path between the first and second electrodes. Such diffused resistors have a positive temperature coefficient of resistance, that is their resistance increases with temperature and can thus be used to sense temperature.

U.S. Pat. No. 4,092,662 describes a temperature sensitive resistor in which the temperature coefficient of resistance is selected by selecting the doping of the diffused resistor. The diffused resistor is formed in an isolation well and one of the resistor electrodes is electrically shorted to the isolation well. Several of these resistors may be connected in series to enable control of the voltage coefficients of resistance.

U.S. Pat. No. 5,039,878 (EP-A-369530) describes an example of a temperature sensing circuit in which the voltage across a diffused resistor temperature sensing device is compared with that across a second temperature sensing device having a negative temperature coefficient of resistance, for example a diode, to provide a more accurate indication of the sensed temperature.

Diffused resistors do however tend to have a temperature coefficient of resistance which varies significantly with temperature. In particular, the temperature coefficient of resistance of a diffused resistor tends to fall or decrease with temperature, that is the increase in resistance with temperature becomes smaller at higher temperatures, which can present problems and lead to less accurate temperature sensing in some applications.

SUMMARY OF THE INVENTION

According to the present invention, there is provided a temperature sensing device comprising a semiconductor body having a first region of one conductivity type adjacent one major surface within which is formed a semiconductor device having a resistance which varies with temperature, characterised in that the semiconductor diode comprises a second region of the opposite conductivity type formed within the first region and a third region of the one conductivity type formed within the second region, first and second electrodes spaced apart on the third region so that a resistive path is provided by the third region between the first and second electrodes and a reference electrode for connecting the second region to a reference potential, the impurity concentrations within the second and third regions being such that the temperature coefficients of resistance of the diffused resistor formed by the third region and the junction field effect transistor like structure formed by the second and third regions counteract to provide the semiconductor device with a temperature coefficient of resistance which changes with absolute temperature so that the relative temperature coefficient of resistance referred to the sensed temperature is substantially constant.

In a temperature sensing device in accordance with the invention, the impurity concentrations within the second and third regions are such that the temperature dependence of the resistance of the diffused resistor formed by the third region and of the junction field effect transistor like structure formed by the second and third regions counteract to provide the semiconductor device with a temperature coefficient of resistance which changes, generally increases or falls only slightly, with absolute temperature such that the relative temperature coefficient of resistance referred to the sensed temperature is substantially constant.

In contrast, a conventional diffused resistor has a temperature coefficient of resistance which falls or decreases significantly with temperature. As the relative temperature coefficient, that is the temperature coefficient referred to the sensed temperature, of a temperature sensing device in accordance with the invention is substantially constant, more accurate temperature sensing should be possible.

The second region may have a surface impurity concentration in the region of 10 to $13 \times 10^{12}$ atoms $cm^{-2}$ and the third region may have a surface impurity concentration in the region of 2 to $3 \times 10^{12}$ atoms $cm^{-2}$. Typically the second region may have a surface impurity concentration of $13 \times 10^{12}$ atoms $cm^{-2}$ and the third region may have a surface impurity concentration of $2.3 \times 10^{12}$ atoms $cm^{-2}$. The second region may have a depth of about 2 $\mu m$ and the third region a depth of about 0.3 to 0.4 $\mu m$.

A temperature sensing circuit in accordance with the invention for sensing the temperature of an active semiconductor device may comprise at least one temperature sensing device provided at a first position adjacent the active semiconductor device, at least one other temperature sensing device provided at a second position remote from the active semiconductor device and means responsive to the temperature sensing devices for providing a control signal to switch off the active semiconductor device when the difference in the temperature sensed by the at least two temperature sensing devices exceeds a predetermined value.

A temperature sensing circuit in accordance with the invention thus provides respective temperature sensing devices one close to, and the other further from, the active device so enabling the temperature difference between the two temperature sensing devices to be determined. In certain conditions in active semiconductor devices such as power MOSFETs, for example, where a low resistance (say about 100 m$\Omega$), load is connected between ground and the active semiconductor device, the temperature at the center of the active semiconductor device rises much more quickly than that of the surrounding semiconductor body so that a steep temperature gradient occurs at the periphery of the active semiconductor device. A temperature sensing circuit in accordance with the invention allows this steep temperature gradient to be detected and to be used to provide a signal to switch off the active semiconductor device before it overheats significantly. Accordingly, excessive temperatures can be detected quickly and the circuit can be particularly sensitive to temperature changes.

Furthermore, because temperature sensing devices in accordance with the invention have an effective temperature coefficient of resistance which changes with temperature so that their relative temperature coefficient of resistance remains substantially constant, the predetermined value or critical differential temperature should remain substantially constant regardless of the initial absolute temperature and accordingly the circuit will maintain a substantially constant sensitivity to differential temperature regardless of the actual temperatures sensed. This contrasts to the situation where diffused resistor temperature sensing devices are used in such a circuit where the differential temperature at which the circuit trips, that is the predetermined value, will actually fall with temperature.

In one example of a temperature sensing circuit in accordance with the invention for sensing the temperature of an active semiconductor device first and second temperature sensing devices are provided at a first position adjacent the active semiconductor device and third and fourth temperature sensing devices are provided at a second position remote from the active semiconductor device, the temperature sensing devices being connected in a Wheatstone bridge with the first and third devices and the second and fourth devices, respectively, connected in series between first and second supply lines and with the second and third devices connected to the first supply line and the means for comparing a first signal representing the voltage at a first junction between the third and first devices and a second signal representing the voltage at a second junction between the second and fourth devices and for providing an output signal which provides the control signal to switch off the active semiconductor device when the difference between the first and second voltage signals represents a temperature difference of the predetermined value.

Such a Wheatstone bridge arrangement makes the circuit more sensitive as the difference signal being detected is amplified because the increase in temperature and thus resistance of the first and second temperature sensitive devices acts to increase the voltage at the first junction whereas the similar increase in temperature experienced by the third and fourth temperature sensitive devices acts to reduce the voltage at the second junction.

The temperature sensing circuit may further comprise a transistor having its main current path connected between the first junction and the first element and another transistor having its main current path connected between the second junction and the fourth element with the gates of the transistors being connected to one another and to one of the first and second junctions. The incorporation of the current-mirror connected transistors should enable a larger differential gain which results in a lower accuracy requirement for the comparing means. Also, because this arrangement should have a higher sensitivity, it may be particularly useful where the elements have a smaller temperature coefficient of resistance or a higher noise margin.

Conveniently, means are provided for preventing the active semiconductor device from being switched on again until the temperature difference has fallen to a second predetermined value below the predetermined value. Such an arrangement introduces a hysteresis into the circuit and thus prevents the circuit from repeatedly switching the active semiconductor device on and off for small changes in temperature.

BRIEF DESCRIPTION OF THE DRAWINGS

Embodiments of the invention will now be described, by way of example, with reference to the accompanying drawings, in which.

DETAILED DESCRIPTION OF THE PREFERRED EMBODIMENT

Figure 1:
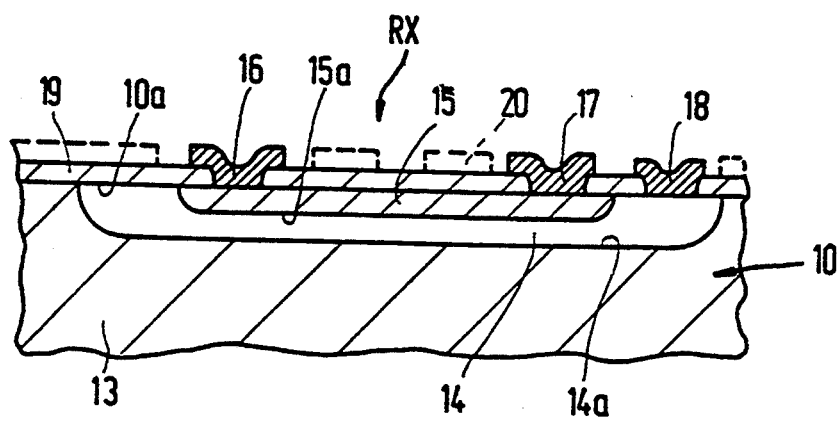
FIG. 1 is a cross-sectional view through part of a semiconductor body illustrating a temperature sensing device in accordance with the invention.
Figure 5:
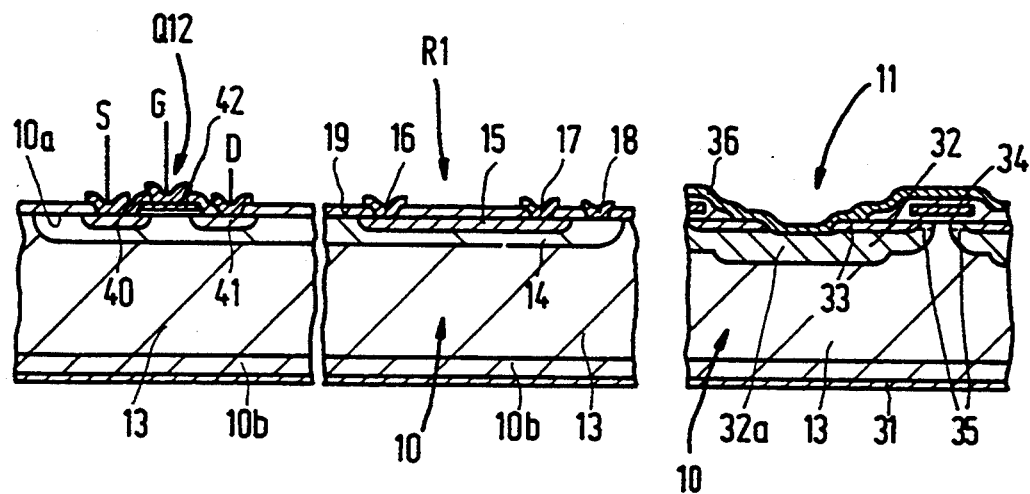
FIG. 5 is a cross-sectional view through part of a semiconductor body in which the circuit shown in FIG. 4 is formed for illustrating the structure of various components.
Figure 7:
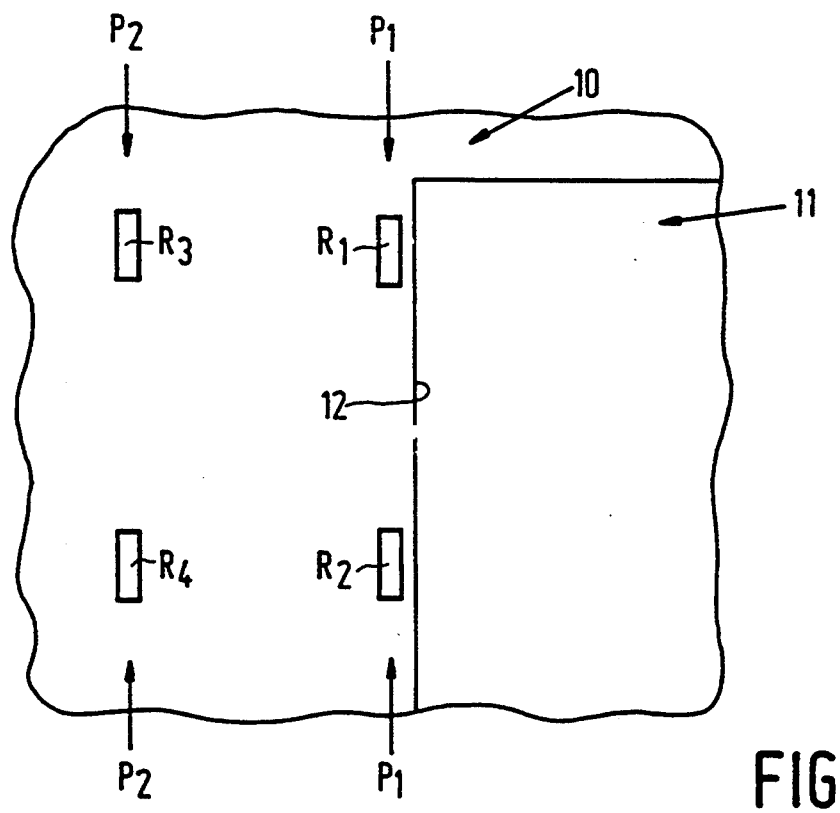
FIG. 7 is a plan view of the semiconductor body shown in part in FIG. 5 for illustrating very schematically possible relative locations of an active semiconductor and temperature sensing devices.

It should be understood that FIGS. 1,5 and 7 are merely schematic and are not drawn to scale. In particular certain dimensions such as the thickness of layers or regions may have been exaggerated while other dimensions may have been reduced. It should also be understood that the same reference numerals are used throughout the Figures to indicate the same or similar parts.

Figure 4:
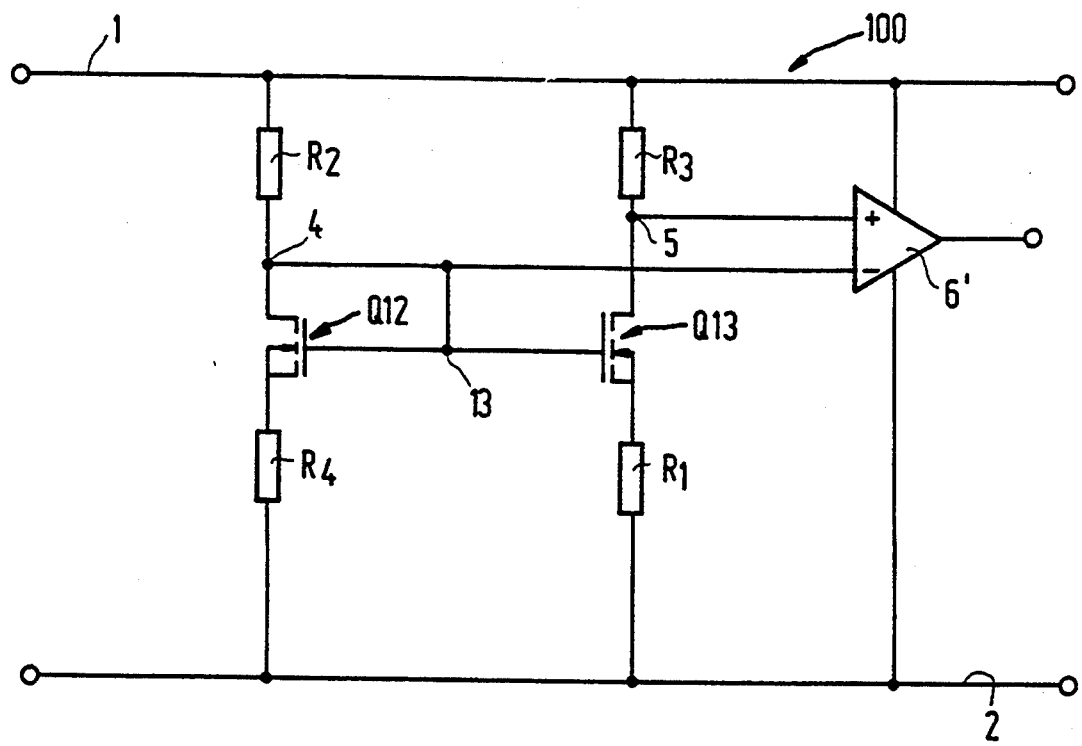
FIG. 4 shows a circuit diagram for one embodiment of a differential temperature sensing circuit in accordance with the invention.

Referring now to the drawings especially FIGS. 1 and 4, there is illustrated a temperature sensing device comprising a semiconductor body 10 having a first region 13 of one conductivity type adjacent one major surface 10a within which is formed a semiconductor device RX having a resistance which varies with temperature. The semiconductor device RX comprises a second region 14 of the opposite conductivity type formed within the first region 13 and a third region 15 of the one conductivity type formed within the second region 14, first and second electrodes 16 and 17 spaced apart on the third region 15 so that a resistive path is provided by the third region 15 between the first and second electrodes 16 and 17 and a reference electrode 18 for connecting the second region 14 to a reference potential, the impurity concentrations within the second and third regions 14 and 15 being such that the temperature coefficients of resistance of the diffused resistor formed by the third region 15 and the junction field effect transistor like structure formed by the second and third regions 14 and 15 counteract to provide the semiconductor device RX with a temperature coefficient of resistance a which changes with absolute temperature such that the relative temperature coefficient of resistance referred to the sensed temperature is substantially constant.

Thus, because the temperature coefficient of resistance $\alpha$ changes with absolute temperature such that the relative temperature coefficient of resistance remains substantially constant, the sensitivity to temperature of a temperature sensing device in accordance with the invention is substantially independent of temperature, more accurate temperature sensing should be possible. Such a temperature sensing device is of particular advantage in a temperature sensing circuit such as the ones 100,100a, to be described below with reference to FIGS. 7 and 8 in which at least one temperature sensing device R1,R2 is provided at a first position P1 adjacent an active semiconductor device 11 whose temperature is to be sensed and at least one other temperature sensing device R3,R4 is provided at a second position P2 remote from the active semiconductor device 11 and means 6 responsive to the first and second temperature sensing devices R1,R2 and R3,R4 for providing a control signal to switch off the active semiconductor device 11 when the difference in the temperature sensed by the at least two temperature sensing devices R1,R2 and R3,R4 exceeds a predetermined value, that is exceeds a critical differential temperature $\Delta T_c$.

In certain conditions in active semiconductor devices such as power MOSFETs, for example, where a low resistance (say about 100 m$\Omega$), load is connected between ground and the active semiconductor device, the temperature at the center of the active semiconductor device rises much more quickly than that of the surrounding semiconductor body so that a steep temperature gradient occurs at the periphery 12 of the active semiconductor device 11. A temperature sensing circuit in accordance with the invention allows this steep temperature gradient to be detected and to be used to provide a signal to switch off the active semiconductor device before it overheats significantly. Accordingly, excessive temperatures can be detected quickly and the circuit can be particularly sensitive to temperature changes.

Furthermore, because the temperature sensing devices R1 to R4 in accordance with the invention have an effective temperature coefficient of resistance which actually changes with temperature so that their relative temperature coefficient of resistance remains substantially constant, the predetermined value or differential temperature should remain substantially constant regardless of the initial absolute temperature and accordingly the circuit 100,100a will maintain a substantially constant sensitivity to differential temperature regardless of the actual temperatures sensed.

Referring now specifically to the examples shown in the Figures, FIG. 1 is a cross-sectional view through part of the semiconductor body 10. In this example, the semiconductor body 10 comprises a lowly doped (the doping concentration may be in the area typically used for the drain drift regions of vertical power MOSFETs) epitaxially grown layer of n conductivity type silicon 13 which may be provided (not shown in FIG. 1) on a more highly doped monocrystalline silicon substrate. The epitaxial layer 13 forms the first region. The second region 14 is formed as a planar region by introducing, using an appropriate mask, p conductivity type impurities, generally boron ions with a dose (which determines the surface concentrations) in the region $10 \times 10^{12}$ to $13 \times 10^{12}$ atoms cm$^{-2}$, while the third region 15 is formed as a planar region within the second region 14 by introducing impurities using an appropriate mask with a dose in the region of $2 \times 10^{12}$ to $3 \times 10^{12}$ atoms cm$^{-2}$. An insulating layer, generally of silicon dioxide and typically 1.8 $\mu$m thick, 19 is provided on the one major surface 10a and after opening contact windows metallisation is deposited to provide the first and second electrodes 16 and 17 and the reference electrode 18.

As indicated in phantom lines (and shown unhatched in the interests of clarity) in FIG. 1, the metallisation forming the electrodes 16,17 and 18 may be patterned to define an electrostatic shield 20 which may be connected to an appropriate potential or may be electrically isolated or floating. The electrostatic shield 20 may, as shown, be formed with a break 21 in the area over the third region 15 (i.e. between the electrodes 16 and 17). The resistance of the resistor may be fine-tuned by biasing the ends of the resistor differently and by adjusting the location of the break 21 (that is by moving it closer to one or other of the electrodes 16 and 17).

Figure 2:
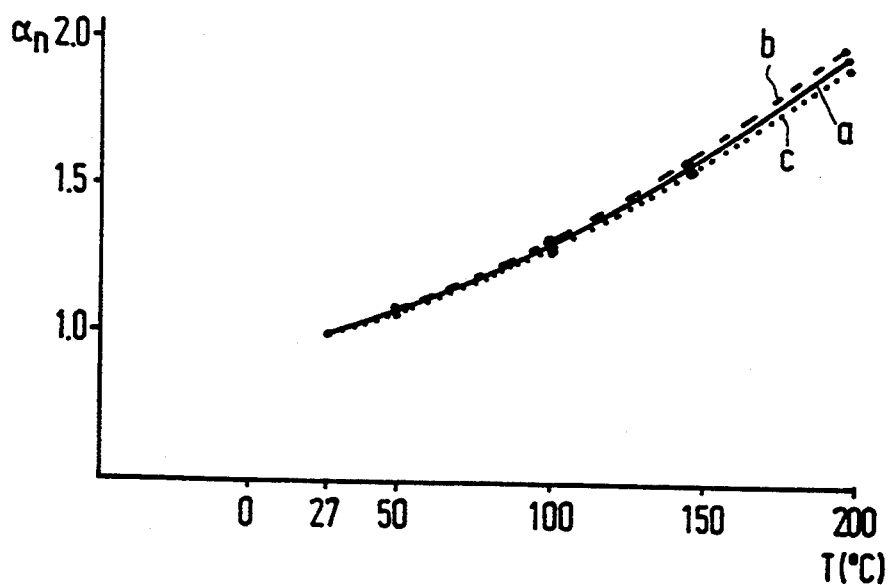
FIGS. 2 and 3 are graphs for illustrating the relationship between temperature and the temperature coefficient of resistance of a temperatures sensing device in accordance with the invention.
Figure 3:
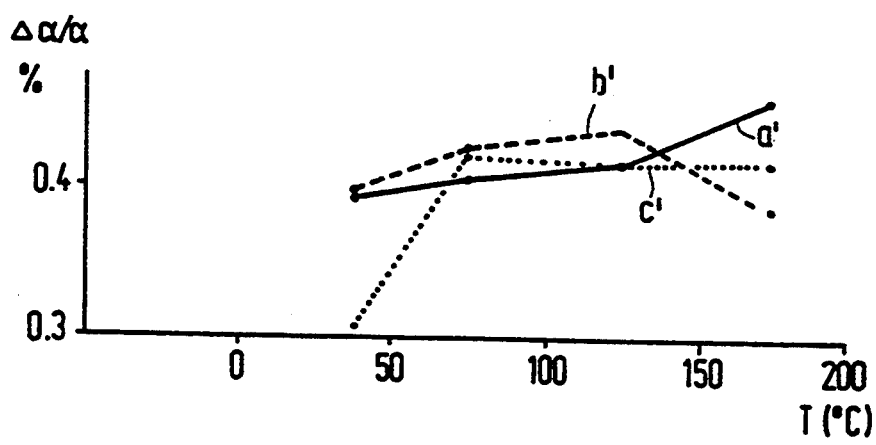

FIGS. 2 and 3 illustrate graphically the measured relationships (indicated by dot points) between the temperature coefficient of resistance and temperature for three different devices with various different doses of arsenic and boron. FIG. 2 plots the normalised temperature coefficient $\alpha_n$ of resistance against temperature in degrees Celsius where the temperature coefficient $\alpha$ is normalised by division by the temperature coefficient $\alpha$ at 27° that is so that the temperature coefficient $\alpha$ at 27°=1. FIG. 3 plots the temperature coefficient normalised to each temperature interval against temperature T in degrees Celsius (°C.). Effectively FIG. 3 plots the temperature coefficient at a given temperature normalised with respect to that at the preceding temperature and so indicates the percentage change $\Delta\alpha/\alpha$ in the temperature coefficient. As will be appreciated FIG. 3 thus indicates the slope $\Delta\alpha$ at selected points of the graph of the temperature coefficient against temperature T. More accurate results may be obtained by using smaller temperature intervals and so getting closer to a mathematical differentiation of the $\alpha$ against T curve. However FIG. 3 does serve to indicate at least roughly the percentage change in the temperature coefficient $\alpha$ as a function of temperature.

In FIGS. 2 and 3 the actual measurement parts are indicated by dots while the respective lines a, a', b, b', c, c' merely connect together the measurement points for the source device.

Solid lines a,a' illustrate the relationship for a temperature sensing device Rx where the second region 14 is formed by introducing boron ions to provide a surface concentration (i.e. the dose of the implantation) of $13 \times 10^{12}$ atoms cm$^{-2}$ and the third region 15 is formed by introducing arsenic ions to provide a surface concentration of $2.7 \times 10^{12}$ atoms cm$^{-2}$ with the device having a resistance at 27° C. of 175 Kilo-ohms. The dashed lines b,b' in FIGS. 2 and 3 indicate the relationship for a device Rx where the second region 14 has a surface impurity concentration of $11 \times 10^{12}$ atoms cm$^{-2}$ and the third region 15 has a surface concentration of $2.7 \times 10^{12}$ atoms cm$^{-2}$ and a resistance at 27° C. of 141 Kilo-ohms while the dotted lines c,c' indicate a device Rx in which the second region 14 has a surface concentration of $13 \times 10^{12}$ atoms cm$^{-2}$ and the third region 15 has a surface concentration of $2.3 \times 10^{12}$ atoms cm$^{-2}$ with the resistance at 27° C. being 238 Kilo-ohms. In each case the measurements were made with the reference electrode 18 at 0 volts (earthed or grounded) and 5 volts between the first and second electrodes 16 and 17. The last mentioned device illustrated by lines c and c' had the lowest pinch-off voltage and, at 5 volts, displayed the most significant JFET like effects.

As can be seen from FIGS. 2 and 3, the change with temperature T of the temperature coefficient $\alpha$ that is the slope $\Delta\alpha/\Delta T$ for these devices is very small so that the relative temperature coefficient, referred to the measurement temperature, is virtually constant. It is believed that this results from the interaction of the temperature dependence of the resistance of the third region 15 and that of the JFET-like structure formed by the second and third regions 14 and 15.

To give a specific example of a resistor in accordance with the invention, where the epitaxial layer 13 is about 5 $\mu$m (micrometres) in thickness and has a resistivity which enables it to withstand a voltage of about 60V, then the second and third regions 14 and 15 may be formed by implanting first boron ions at a dose of $2.3 \times 10^{12}$ ions cm$^{-2}$ with an energy of 170KeV (Kiloelectron volts) and then arsenic ions at a dose of $1.3 \times 10^{13}$ ions cm$^{-2}$ with an energy of 170KeV through a thin (generally 300Å) oxide layer such that the peak of the boron implant lies at about 0.5 $\mu$ (micrometres) below the surface of the semiconductor body 10. The implanted impurities are then caused to diffuse into the semiconductor body 10 by heating the semiconductor body 10 to a temperature of about 1100° C. (degrees Celsius) for about four hours so that the second region 14 has a depth of about 2 $\mu$m (with its peak dopant concentration just below the surface) and the third region 15 has a depth of about 0.3 to 0.4 $\mu$m. A region forming using the same conditions as those described above for the second region 14 but without the third region 15 was found to have a resistance of 5k$\Omega$. $\square^{-1}$ (Kiloohms per square) and a temperature coefficient of resistance, referenced to room temperature, which changed by 0.7 or 0.8% per °C. In constrast, the resistor (complete with the third region 15 formed within the second region 14) was found to have a resistance (in the third region 15) of 10k$\Omega$. $\square^{-1}$ and a differential temperature coefficient of resistance $\Delta\alpha/\alpha$ referenced to the preceding temperature which changed by 0.4% per °C. so that the temperature coefficient with respect to room temperature was actually falling slightly.

FIG. 4 illustrates one example of a temperature sensing circuit 100 utilising temperature sensing device Rx in accordance with the invention. In this example four such temperature sensing devices R1,R2,R3 and R4 are used.

The temperature sensing circuit 100 has first and second power supply lines 1 and 2. The first power supply line 1 is the positive and the second power supply line 2 the negative supply line, generally earth in this example.

In this example, four temperature sensing devices Rx which are shown as resistors R1 to R4 are arranged in a Wheatstone bridge connected between the power supply lines 1 and 2. The first and second resistors R1 and R2 are provided in opposite arms of the Wheatstone bridge. The third and first resistors R3 and R1 are connected in series between the power supply lines 1 and 2 as are the second and fourth resistors R2 and R4 so that, as shown in FIG. 4, the second and third resistors R2 and R3 are connected to the first or positive supply line 1 while the first and fourth resistors R1 and R4 are connected to the second or negative supply line 2.

In the circuit shown in FIG. 4, a first n-channel MOSFET Q12 is connected in series between the resistors R2 and R4 so that its source is connected to resistor R4 and its drain to resistor R2. A second n-channel MOSFET Q13 matched or similar to MOSFET Q12 is connected between the resistors R3 and R1 with its source connected to the resistor R1 and its drain connected to the resistor R3.

The gates of the two MOSFETs Q12 and Q13 are connected together at a node 13 and the gate of the MOSFET Q12 is connected to its drain at node 4. The node 4 is also connected to one input of a comparator 6 while a node 5 between the resistor R3 and the drain of MOSFET Q13 is connected to the other input of the comparator 6. The comparator 6 may have any suitable form although it is preferred that the use of p-channel MOSFETs and bipolar transistors be avoided.

The operation of the circuit shown in FIG. 4 will now be described assuming, in the interests of simplicity, that the gain of the MOSFETs Q12 and Q13 is very high so that their gate-source voltage Vgs is nearly constant. When the resistors R1 to R4 are all at the same temperature R3=KR2 and R4=KR1 with K being, for example, about 1.1. If the current through resistor R2, MOSFET Q12 and resistor R4 is defined as I' the current I'' flowing through resistor R1 is approximately (R4/R1)I'=KI'. The voltage across resistor R2 is I'R2. The voltage across resistor R3 is I''R3=KI'R3=K2I'R2. The difference in voltage between the nodes 4 and 5 is therefore:

$$\Delta V = I'R2(1-K^2)$$

As the temperature of the hot resistors R2 and R1 increases the value of K will decrease until K=1 when the temperature difference between the hot resistors R2 and R1 and the cold resistors R3 and R4 reaches the critical value. At this point the difference in voltage $\Delta V=0$. As the temperature of the resistors R1 and R2 increases further the resistance of the resistors R1 and R2 will exceed that of the resistors R3 and R4 and the comparator 6 will provide a signal for switching off the active semiconductor device 11.

The incorporation of the current-mirror connected MOSFETs Q12 and Q13 enables a larger differential gain which results in a lower accuracy requirement for the comparator 6'. The circuit 100 should have a higher sensitivity than the circuit 100a described below with reference to FIG. 8 and thus may be useful where the resistors R1 to R4 have a small temperature coefficient of resistance or a high noise margin which characteristics will primarily be determined by the process used to form the resistors.

FIG. 5 is a cross-sectional view of part of the semiconductor body 10 for illustrating the integration of the circuit 100 with a power semiconductor device 11 such as a power MOSFET. It will of course be appreciated that only part of the structure is shown in FIG. 5. The interconnections between the various components are not shown in FIG. 5.

In the example of FIG. 5, the semiconductor body 10 comprises a relatively highly doped n conductivity type monocrystalline silicon substrate 10b onto which is provided the relatively lowly doped n conductivity type epitaxial layer 13. In this example the power semiconductor device is a vertical power MOSFET 11 which consists of very many (hundreds of thousands) parallel-connected source cells sharing a common drain drift region provided by the epitaxial layer 13. The relatively highly doped substrate 10b provides a drain contact region which makes ohmic contact to the drain electrode 31. Each source cell comprises a p conductivity type body region 32 within which is formed an n conductivity type source region 33. In this case, the body and source regions 32 and 33 may be formed in a self-aligned manner by using the insulated gate structure 34 of the MOSFET as a mask so as to define the conduction channel region 35 of the MOSFET by the relative diffusions of the impurities introduced to form the body and source regions 32 and 33. The body region 32 may have a more highly doped central region 32a.

In this example, the power semiconductor device 11 is to form a low side switch and accordingly the source metallisation 36 (which also shorts the source region 33 to the body region 32 to avoid parasitic bipolar action) may be connected to earth while the drain electrode 31 will be connected to the load. The gate metallisation is not shown in FIG. 5.

As indicated above, each temperature sensing device R1 to R4 is formed having its own separate second region 14. As the resistors R1 to R4 are the same in structure only one resistor R1 is shown in FIG. 5. However, it may be possible for the two 'hot' resistors R1 and R2 to share a common second region 14 positioned at position P1 which may, as shown in FIG. 7, be adjacent the periphery 12 of the active device 11 or may actually be surrounded by the power MOSFET source cells and so positioned centrally within the power MOSFET 11 enabling more accurate detection of the temperature at the center of the power MOSFET 11.

The cold resistors R3 and R4 may be provided in a single second region 14 remote from the power MOSFET 11. The MOSFETs Q12 and Q13 may be formed in the same second region as the cold resistors R3 and R4. As indicated above each second region 14 is relatively lowly doped and may for example have a surface dopant concentration in the region of 11 to $13 \times 10^{12}$ atoms cm$^{-2}$ where the dopant is boron.

The IGFETs Q12 and Q13 both have a similar structure and accordingly only one IGFET Q12 is shown in FIG. 5. As can be seen from FIG. 5, the IGFET Q12 has n conductivity type source and drain regions 40 and 41 formed in an autoaligned manner, using the insulated gate 42 as a mask, with a single implantation. The source, drain and gate metallisation S, D and G are provided in conventional manner. The back gates of MOSFETs Q12 and Q13 will in this case be connected to the negative supply line 2 by means of the reference electrode 18 contacting the second region 14.

Figure 6:
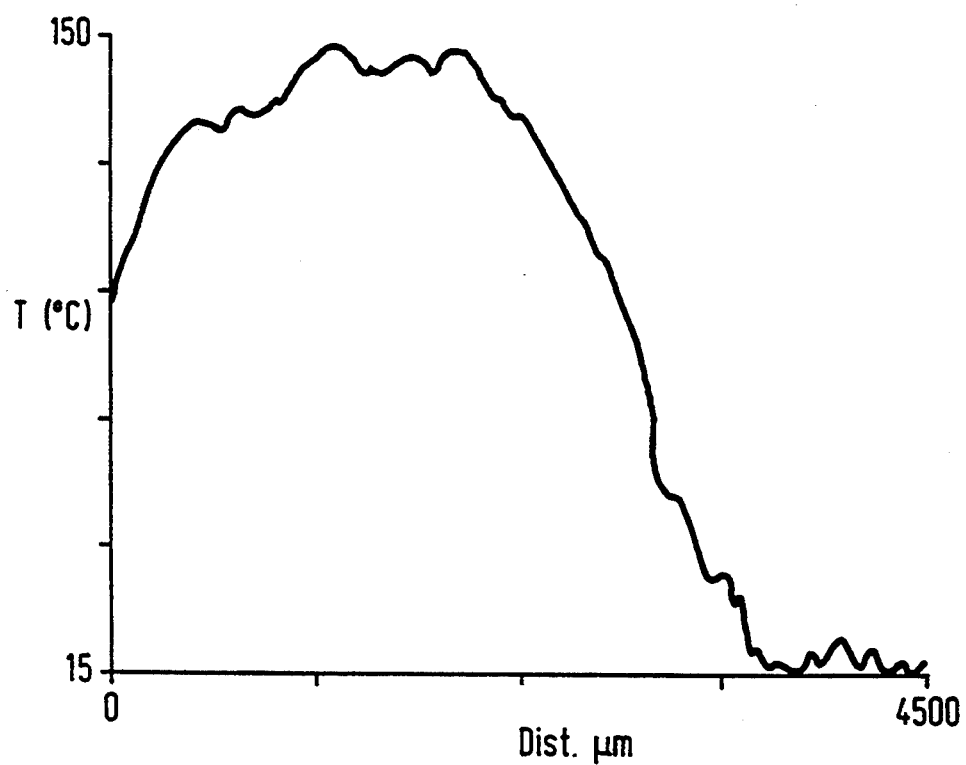
FIG. 6 illustrates graphically a typical temperature profile from the center to the periphery of a power MOSFET.

FIG. 6 illustrates graphically the change in temperature from the center to the edge of a typical active semiconductor device such as a power MOSFET with a source-drain voltage of 21 volts and a power of dissipation of 300 watts when for example an overload of small resistance (for example about 100 mΩ) is applied between the power MOSFET and ground (earth).

Under such conditions where a relatively small resistance overload is so applied, the temperature at the center of the power MOSFET will rise rapidly whereas the temperature in the bulk or remainder of the semiconductor body will rise only slowly. Accordingly, as illustrated in FIG. 6, a steep temperature gradient occurs adjacent the periphery 12 of the power MOSFET. By locating the first and second temperature sensing devices R1 and R2, at a first position P1 adjacent, generally just outside, the periphery 12 of the power MOSFET and the third and fourth temperature sensing devices R3 and R4, at a second position P2 further from the periphery 12 of the active device 11 where the temperature is only changing slowly, if at all, the temperature gradient at the periphery of the power MOSFET can be detected and when it reaches a certain value the power MOSFET can be switched off by the circuit described with reference to FIG. 1.

As indicated above, the temperature sensing circuit 100 is integrated in or on the same semiconductor body as the active device, in this example a power MOSFET. FIG. 7 indicates very schematically a plan view of the top surface of the semiconductor body 10 to show the relative locations of the periphery 12 of the power MOSFET 11 and the first and second temperature sensitive devices R1 to R4. Typically, where the power MOSFET is a vertical DMOSFET having a surface area of 10 mm$^2$ and consisting of, for example, 10,000 to 20,000 parallel cells, then the 'hot' temperature sensing devices R1 and R2 may be positioned at a first position P1 which is 125 μm distant from the MOSFET periphery 12 although as indicated above, the resistors R1 to R4 could be provided amongst the source cells of the power MOSFET 11. The 'cold' temperature sensing devices R3 and R4 may be positioned at a second position P2 1125 μm distant from the periphery 12 of the power MOSFET 11 and the resistances of the temperature sensitive elements R1 to R4 may be selected such that the comparator 6 provides a high output signal resulting in a low signal OT to switch off the power MOSFET 11, when the temperature gradient between the first and second positions P1 to P2 reaches 25° C. In this example, the resistors R1 and R2 may have a resistance which is, for example, 0.9 times that of the resistors R3 and R4. It should be understood that the reference to the periphery 12 of the power MOSFET means the last row of cells and that the above measurements are taken between the periphery 12 and the center of the resistors forming the temperature sensing devices R1 to R4.

Figure 8:
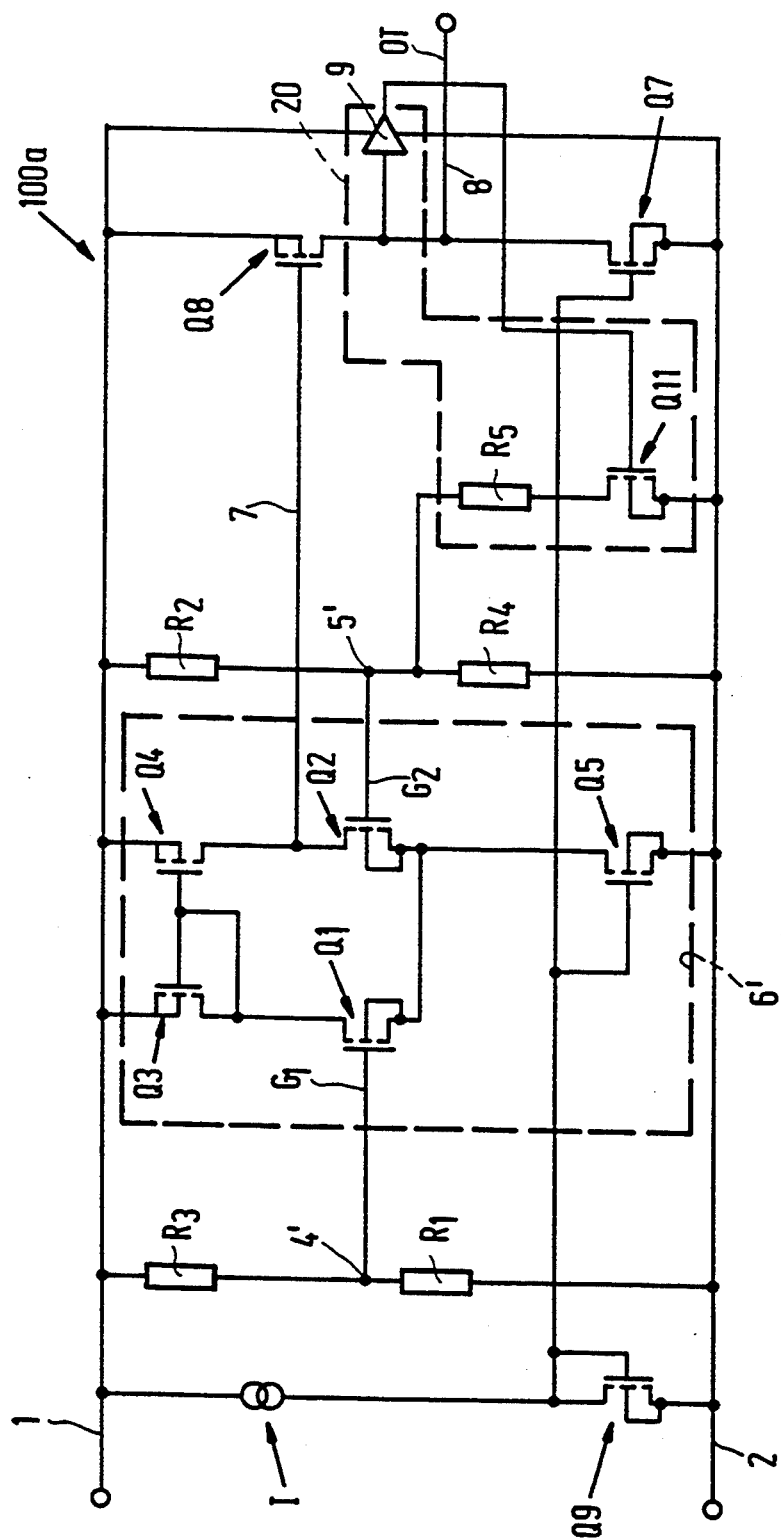
FIG. 8 illustrates a circuit diagram for a modified version of the differential temperature sensing circuit shown in FIG. 4.

FIG. 8 illustrates the circuit diagram of another form of temperature sensing circuit 100a which may be used where complementary MOS technology is easily applied and where, for example, the active semiconductor device 11 is a power MOSFET forming a high side switch that is where the MOSFET 11 is connected between the positive supply line 1 and the load.

As in the example shown in FIG. 1, the circuit 100' has positive and negative supply lines 1 and 2 and uses a Wheatstone bridge arrangement comprising four temperature sensing devices or resistors R1 to R4 similar to those shown in FIGS. 1, 4 and 7 with again the resistors R1 and R2 forming the 'hot' resistors at position P1 and the resistors R3 and R4 forming the cold resistors at position P2. In this example the MOSFETs Q12 and Q13 are omitted.

The outputs from the Wheatstone bridge are taken from a first junction 4' between the third and first resistors R3 and R1 and a second junction 5' between the second and fourth resistors R2 and R4 and are supplied as respective inputs to a comparator 6 which provides a control signal to switch off the active semiconductor device 11 when the voltage at the first junction 4' exceeds the voltage at the second junction 5'.

In this example, the resistors R1 to R4 are selected such that when all four resistors R1 to R4 are at the same temperature the 'hot' first and second resistors R1 and R2 are of lower resistance than the third and fourth resistors R3 and R4. Thus, when there is no temperature difference between the first and second temperature sensitive devices R1,R2 and R3,R4, the voltage at the second junction 5' is higher than the voltage at the first junction 4' and the Wheatstone bridge does not reach a balance (that is the point at which the voltages at the first and second junctions 4' and 5' are equal) until the temperature of the first and second resistors R1 and R2 has increased sufficiently for their resistances to equal the resistances of the resistors R3 and R4.

By selecting the relative values of the resistors R1,R2 and R3,R4, the temperature gradient between the first and second temperature sensing devices R1,R2 and R3,R4 at which the comparator 6' provides a control signal to switch off the active device 11 can be selected. The respective values of the resistors R1 and R2 and the resistors R3 and R4 will be dependent upon many variables such as the characteristics of the resistors and other elements of the circuit and the respective distances of the resistors from the periphery 12 of the active semiconductor device 11. In this example, the resistance of the resistors R1 and R2 increases with temperature in such a manner that a balance is reached when there is a temperature difference of, for the values given above, 25° C. between the first and second temperature sensing devices. Any temperature difference exceeding this value will cause the active semiconductor device to be switched off.

In the circuit shown in FIG. 8, the comparator 6 comprises a B differential pair of matched transistors Q1 and Q2 which form the input transistors of the comparator 6'. In this example, the transistors Q1 and Q2 are n-channel MOSFETs with their gates G1 and G2 connected to the first and second junctions 4' and 5', respectively. The comparator 6' also includes two p-channel matched MOSFETs Q3 and Q4 having their source electrodes connected to the first supply line 1. The gate electrodes of the MOSFETs Q3 and Q4 are connected while the gate electrode of MOSFET Q3 is also connected to its drain. The MOSFETs Q3 and Q4 thus provide a current mirror arrangement and with their drain electrodes connected to respective ones of the drain electrodes of the MOSFETs Q1 and Q2 provide an active load for the differential pair Q1 and Q2.

The sources of the MOSFETs Q1 and Q2 are connected to the drain of an n-channel MOSFET Q5. The source of the MOSFET Q5 is connected to the second or negative supply line Z while its gate is connected to the gate of a gate-drain connected n-channel MOSFET Q9 which is connected in series with a conventional current source I which may, in this example, be a resistor (typically with a resistance of 200 Kilo-ohms) connected between the supply lines 1 and 2 because, in this example, the voltages on the supply lines 1 and 2 are fixed. Alternatively, a suitable conventional external current source may be connected between the supply lines 1 and 2. The current source I forces current into MOSFET Q9 and this current is mirrored in MOSFET Q5 which thus acts as a current source of a value determined by the external current source I for the differential amplifier comparator 6'. Other suitable structures may, of course, be used to form the comparator 6'.

The output 7 of the comparator 6' is supplied to the gate of a p-channel MOSFET Q8 which has its source connected to the first supply line 1 and its drain connected via an n-channel MOSFET Q7 to the second supply line 2. The gate of the n-channel MOSFET Q7 is, like that of MOSFET Q5, connected to the external current source I and thus similarly acts as a current source of a value determined by the external current source I. The MOSFETs Q9, Q5 and Q7 are integrated together so as to be similar. It should be understood that, as used herein, the term 'similar' means that the devices, for example transistors, are integrated together so as to be matched or else so as to have a known ratio of effective junction areas so that the current I provided by the current source through the MOSFET Q9 is mirrored in the MOSFETs Q5 and Q7 with the currents through Q5 and Q7 being either equal to (where the transistors are matched) or a known multiple of the current through the MOSFET Q9. With appropriate modification of component values, it may be possible for the MOSFETs Q1 and Q2 and Q3 and Q4 forming the comparator 6' to have known ratios of effective junction areas rather than be precisely matched. The drain of the p-channel MOSFET Q8 provides, via line 8, the control signal OT for controlling the operation of the active semiconductor device 11 (FIG. 3). In addition the drain of p-channel MOSFET Q8 is connected to a NOT gate 9 in the form of an inverter which drives the gate of an n-channel enhancement mode MOSFET Q11. The n-channel MOSFET Q11 is connected in series with a resistor R5 and the series circuit of the n-channel MOSFET Q11 and resistor R5 is connected in parallel with the fourth temperature sensing device R4.

Resistor R5, MOSFET Q11 and inverter or NOT gate 9 provide a hysteresis circuit 20. Thus, when the signal on the output 7 of the comparator 6 is high providing a low output signal OT from the MOSFET Q8 for turning off the active device 11, the NOT gate 9 provides a high input signal to switch on the MOSFET Q11, so connecting the resistor R5 in parallel with the fourth temperature sensing device R4. This reduces the effective resistance of the fourth temperature sensing device R4 so that the temperature of the first and second heat sensitive devices R1 and R2 has to drop to a second predetermined value, typically 20° C. (degrees Celsius), below the predetermined value before the output of the comparator 6' again goes low to provide a high signal OT to switch on the active device 11. This hysteresis circuit 20 prevents the temperature sensing circuit 100 from hunting or cycling, that is, continually causing the active semiconductor device to switch on and off, with small temperature changes.

In operation of the temperature sensing circuit 100a shown in FIG. 8 when there is no temperature difference between the resistors R1 to R4, then the voltage at the second junction 5' will be higher than that at the first junction 4' because, as discussed above, of the ratio of the resistances, so that the comparator 6 provides a low output on output line 7. The MOSFET Q8 is thus on and the output signal OT is high. As the temperature of the resistors R1 and R2 increases so does their resistance and at a temperature selected by the ratio of the ratio of the resistors the bridge will come into balance. As the temperature of the resistors R1 and R2 increases further the resistance of the temperature sensitive devices R1 and R2 will be greater than the resistance of the temperature sensitive devices R3 and R4, so causing the voltage at the first junction 4' to exceed that at the second junction 5'. Typically, this will be arranged to occur when there is a large, typically 25° C., temperature difference between the first and second positions P$_1$ and P$_2$. In such circumstances, the comparator 6' produces a high output signal on output line 7 to the gate of p-channel MOSFET Q8 so that the MOSFET Q8 is off and the circuit 100 provides a low output signal OT for switching off the active device in this case the power MOSFET 11 shown schematically in FIGS. 5 and 7. As mentioned above, at this time, the NOT gate 9 provides a high signal to switch on the MOSFET Q11 so connecting the resistor R5 in parallel with the fourth temperature sensing device R4.

As the power MOSFET 11 has now been switched off, the temperature difference between the first and second positions $P_1$ and $P_2$ will begin to decrease and when this temperature difference drops sufficiently, to reach the second lower predetermined value determined by the resistor R5, the voltage at the second junction 5' will rise above that at the first junction 4' causing the comparator 6' to provide a low output signal to the gate of the MOSFET QS, so switching on the MOSFET Q8 and providing a high output signal OT to switch on the active device 11. At the same time, the inverter or NOT gate 9 provides a low signal switching off the MOSFET Q11 and so disconnecting the resistor R5 so that the comparator 6' will again provide a high output signal for switching off the active device 11 when the first higher predetermined temperature difference is reached.

It should of course be appreciated that temperature sensing devices in accordance with the invention may be used in temperature sensing circuits other than those shown in FIGS. 4 and 8, for example to form the resistor R1 of the temperature sensing circuit described in EP-A-369530 U.S. Pat. No. 5,039,878.

In addition, of course the conductivity type, given above could be reversed with appropriate reversal of polarities. Also the active semiconductor device 11 may be other than a power MOSFET, for example it could be an IGBT.

From reading the present disclosure, other modifications and variations will be apparent to persons skilled in the art. Such modifications and variations may involve other features which are already known in the semiconductor art and which may be used instead of or in addition to features already described herein. Although claims have been formulated in this application to particular combinations of features, it should be understood that the scope of the disclosure of the present application also includes any novel feature or any novel combination of features disclosed herein either explicitly or implicitly, whether or not it relates to the same invention as presently claimed in any claim and whether or not it mitigates any or all of the same technical problems as does the present invention. The applicants hereby give notice that new claims may be formulated to such features and/or combinations of such features during the prosecution of the present application or of any further application derived therefrom.

What is claimed is:

1. A temperature sensing device including a semiconductor body having a first region of one conductivity type adjacent one major surface within which is formed a semiconductor device having a resistance which varies with temperature, wherein the improvement comprises: the semiconductor device including (i) a second region of the opposite conductivity type having an impurity concentration formed within the first region, (ii) a third region of the one conductivity type having an impurity concentration formed within the second region, (iii) first and second electrodes spaced-apart on the third region so that a resistive path is provided by the third region between the first and second electrodes, and (iv) a reference electrode for connecting the second region to a reference potential, the impurity concentrations within the second and third regions being such that the temperature coefficient of resistance changes with absolute temperature so that the temperature coefficient of resistance relative to the sensed temperature is substantially constant.

2. A temperature sensing device according to claim 1, wherein the second region has a surface impurity concentration in the region of about 10 to $13 \times 10^{12}$ atoms $cm^{-2}$ and the third region has a surface impurity concentration in the region of about 2 to about $3 \times 10^{12}$ atoms $cm^{-2}$.

3. A temperature sensing device according to claim 2, wherein the second region has a surface impurity concentration of about $13 \times 10^{12}$ atoms $cm^{-2}$ and the third region has a surface impurity concentration of $2.7 \times 10^{12}$ atoms $cm^{-2}$, the second region having a depth of about 2 $\mu m$ and the third region having a depth in the region of about 0.3 to about 0.4 $\mu m$.

4. A temperature sensing circuit for sensing the temperature of an active semiconductor device, said temperature sensing circuit comprising:
   a) a first temperature sensing device and a second temperature sensing device, each temperature sensing device including a semiconductor body having a (i) first region of one conductivity type adjacent one major surface within which is formed a semiconductor device having a resistance which varies with temperature, (ii) a second region of the opposite conductivity type having an impurity concentration formed within the first region, (iii) a third region of the one conductivity type having an impurity concentration formed within the second region, (iv) first and second electrodes spaced-apart on the third region so that a resistive path is provided by the third region between the first and second electrodes, and (v) a reference electrode for connecting the second region to a reference potential, the impurity concentrations within the second and third regions being such that the temperature coefficient of resistance changes with absolute temperature so that the temperature coefficient of resistance relative to the sensed temperature is substantially constant,
   said first temperature sensing device being disposed at a first position adjacent the active semiconductor device and said second temperature sensing device being disposed at a second position remote from the active semiconductor device, and
   b) control means responsive to the temperature sensing devices for providing a control signal to switch off the active semiconductor device when the difference in the temperatures sensed by the first and second temperature sensing devices exceeds a predetermined value.

5. The temperature sensing circuit for sensing the temperature of an active semiconductor device as claimed in claim 4, wherein the first and second temperature sensing devices are positioned adjacent the active semiconductor device and further including third and fourth of said temperature sensing devices positioned at a second position remote from the active semiconductor device, the temperature sensing devices being connected in a Wheatstone bridge arrangement having first and second supply lines with the first and third devices and the second and fourth devices, respectively, connected in series between the first and second supply lines and with the second and third devices connected to the first supply line and a first junction being formed between the third and first temperature sensing devices and having a first junction voltage a second junction being formed between the second and fourth temperature sensing devices having a second junction voltage said control means includes comparing means for comparing the first junction voltage to the second junction voltage and for providing an output signal which provides the control signal to switch off the active semiconductor device when the difference between the first and second junction voltages represents a temperature difference of the predetermined value.

6. A temperature sensing circuit according to claim 5, further comprising a transistor having its main current path connected between the first junction and the first temperature sensing device and another transistor having its main current path connected between the second junction and the fourth temperature sensing device with the gates of the transistors being connected to one another and to one of the first and second junctions.

7. A temperature sensing circuit according to claim 5 wherein the comparing means comprises first and second transistors having control gates connected to the first and second junctions, respectively, a current mirror arrangement connected between the first supply line and one main electrode of each of the first and second transistors and current source means connected to the other main electrode of each of the first and second transistors, the control signal being supplied via an output connection from the one main electrode of the second transistor.

8. A temperature sensing circuit according to claim 5 further including a resistance in series with switch means across the fourth temperature sensing device, the switch means being controlled by the output signal of the comparing means for connecting the resistance in parallel with the fourth temperature sensing device when the temperature difference exceeds the predetermined value for preventing the active semiconductor device from being switched on again until the temperature difference has fallen to a second predetermined value below the predetermined value.

9. A temperature sensing circuit according to claim 4, wherein the active semiconductor device comprises a power insulated gate field effect device integrated in the same semiconductor body as the temperature sensing devices.

10. A temperature sensing circuit according to claim 6, wherein the comparing means comprises first and second transistors having control gates connected to the first and second junctions, respectively, a current mirror arrangement connected between the first supply line and one main electrode of each of the first and second transistors and current source means connected to the other main electrode of each of the first and second transistors, the control signal being supplied via an output connection from the one main electrode of the second transistor.

11. A temperature sensing circuit according to claim 6 further including a resistance in series with switch means across the fourth temperature sensing device, the switch means being controlled by the output signal of the comparing means for connecting the resistance in parallel with the fourth temperature sensing device when the temperature difference exceeds the predetermined value for preventing the active semiconductor device from being switched on again until the temperature difference has fallen to a second predetermined value below the predetermined value.

12. A temperature sensing circuit according to claim 7 further including a resistance in series with switch means across the fourth temperature sensing device, the switch means being controlled by the output signal of the comparing means for connecting the resistance in parallel with the fourth temperature sensing device when the temperature difference exceeds the predetermined value for preventing the active semiconductor device from being switched on again until the temperature difference has fallen to a second predetermined value below the predetermined value.

13. A temperature sensing circuit according to claim 5, wherein the active semiconductor device comprises a power insulated gate field effect device integrated in the same semiconductor body as the temperature sensing devices.

14. A temperature sensing circuit according to claim 6, wherein the active semiconductor device comprises a power insulated gate field effect device integrated in the same semiconductor body as the temperature sensing devices.

15. A temperature sensing circuit according to claim 7, wherein the active semiconductor device comprises a power insulated gate field effect device integrated in the same semiconductor body as the temperature sensing devices.

16. A temperature sensing circuit according to claim 8, wherein the active semiconductor device comprises a power insulated gate field effect device integrated in the same semiconductor body as the temperature sensing devices.

17. A temperature sensing device according to claim 4, wherein said second regions of said first and second temperature sensing devices have a surface impurity concentration in the region of about 10 to about $13 \times 10^{12}$ atoms cm$^{-2}$ and the third regions of said first and second temperature sensing devices have a surface impurity concentration in the region of about 2 to about $3 \times 10^{12}$ atoms cm$^{-2}$.

18. A temperature sensing device according to claim 4, wherein said second regions of said first and second temperature sensing devices have a surface impurity concentration of about $13 \times 10^{12}$ atoms cm$^{-2}$ and the third regions of said first and second temperature sensing devices have a surface impurity concentration of about $2.7 \times 10^{12}$ atoms cm$^{-2}$, the second regions having a depth of about 2 μm and the third regions having a depth in the region of about 0.3 to about 0.4 μm.

19. An integrated circuit comprising:
a) a semiconductor body;
b) an active semiconductor device occupying a first position on said semiconductor body; and
c) a temperature sensing circuit disposed on said semiconductor body for sensing the temperature of the active semiconductor device, the temperature sensing circuit comprising first and second temperature sensing devices positioned adjacent to the active semiconductor device, and third and fourth temperature sensing devices positioned remote from the active semiconductor device, each of the temperature sensing devices comprising i) a first region of a first conductivity type having a resistance which varies with temperature, ii) a second region of opposite conductivity type, the first and second temperature sensing devices sharing a second region of opposite conductivity type, each second region having an impurity concentration formed within its respective first region, iii) a third region of the one conductivity type having an impurity concentration formed within its respective second region, iv) first and second electrodes spaced-apart on its respective third region so that a resistive path is provided by each of the third regions between their respective first and second electrodes and v) a reference electrode for connecting each of the second regions to a reference potential, the impurity concentrations within the second and third regions being such that the temperature coefficient of resistance changes with absolute temperature so that the temperature coefficient of resistance relative to the sensed temperature is substantially constant.

20. The integrated circuit according to claim 19, wherein the active semiconductor device is a power mosfet including a plurality of parallel source cells and the first and second temperature sensing devices are located at about 125 μm from a last row of the source cells of the power mosfet.

21. The integrated circuit according to claim 19 wherein the active semiconductor device is a power mosfet including a plurality of parallel source cells and the first and second temperature sensing devices are surrounded by the source cells of the power mosfet.

22. The integrated circuit according to claim 19, wherein the temperature sensing devices are connected in a Wheatstone bridge arrangement having i) first and second supply lines; ii) a first mosfet having a main current path; and iii) a second mosfet having a main current path;

wherein the first and third temperature sensing devices and the second and fourth temperature sensing devices respectively are coupled in series between the first and second supply lines, with the second and third temperature sensing devices coupled to the first supply line, and the first mosfet being coupled between the second and fourth temperature sensing devices by its main current path, and the second mosfet being coupled between the third and first temperature sensing devices by its main current path, wherein the third and fourth temperature sensing devices share a second region and the first and second mosfets are formed in the second region shared by the third and fourth temperature sensing devices, a first junction being formed between the third and first temperature sensing devices and having a first junction voltage, a second junction being formed between the second and fourth temperature sensing devices and having a second junction voltage; and the integrated circuit further comprising comparing means for comparing the first junction voltage to the second junction voltage and for providing a control signal to switch off the active semiconductor device when the temperatures sensed by the first and the second temperature sensing devices exceeds a predetermined value.

* * * * *